(12) United States Patent
Katsuda et al.

(10) Patent No.: US 9,374,903 B2
(45) Date of Patent: Jun. 21, 2016

(54) MULTILAYER PRINTED WIRING BOARD FOR MOUNTING SEMICONDUCTOR ELEMENT

(71) Applicant: IBIDEN CO., LTD., Ogaki (JP)

(72) Inventors: Naoki Katsuda, Ogaki (JP); Naoto Ishida, Ogaki (JP); Kota Noda, Ogaki (JP); Nobuhisa Kuroda, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/210,802

(22) Filed: Mar. 14, 2014

(65) Prior Publication Data

US 2014/0262447 A1 Sep. 18, 2014

(30) Foreign Application Priority Data

Mar. 14, 2013 (JP) ................................. 2013-051949

(51) Int. Cl.
  *H05K 1/02* (2006.01)
  *H05K 1/18* (2006.01)
  *H05K 3/40* (2006.01)
  *H05K 3/46* (2006.01)

(52) U.S. Cl.
  CPC .............. *H05K 1/185* (2013.01); *H05K 3/4007* (2013.01); *H05K 3/4661* (2013.01); *H05K 2201/094* (2013.01)

(58) Field of Classification Search
  CPC .................................................... H05K 1/0298
  USPC .......................... 361/763–766; 174/259–264; 257/690–692
  See application file for complete search history.

(56) References Cited

U.S. PATENT DOCUMENTS

| 7,936,567 | B2 * | 5/2011 | Takashima | .......... H01L 21/4857 174/261 |
| 2009/0183910 | A1 * | 7/2009 | Sunohara | ................ H01L 23/13 174/266 |
| 2009/0236128 | A1 * | 9/2009 | Tsukada | ................ H05K 3/386 174/256 |

FOREIGN PATENT DOCUMENTS

JP 2008-177503 7/2008

* cited by examiner

*Primary Examiner* — Tuan T Dinh
*Assistant Examiner* — Rockshana Chowdhury
(74) *Attorney, Agent, or Firm* — Oblon, McClelland, Maier & Neustadt, L.L.P.

(57) ABSTRACT

A multilayer printed wiring board for mounting a semiconductor element includes a core substrate, a first laminated structure on first surface of the substrate and including a conductive circuit layer on the first surface of the substrate, a resin insulating layer and the outermost conductive circuit layer, and a second laminated structure on second surface of the substrate and including a conductive circuit layer on the second surface of the substrate, a resin insulating layer and the outermost conductive circuit layer. The outermost conductive layer in the first structure has solder pads positioned to mount a semiconductor element and solder bumps formed on the pads, respectively, the outermost conductive layer in the second structure has solder pads positioned to mount a wiring board, and the outermost conductive layers in the first and second structures have thicknesses formed greater than thicknesses of the conductive layers on the surfaces of the substrate.

20 Claims, 5 Drawing Sheets

MULTILAYER PRINTED WIRING BOARD FOR MOUNTING SEMICONDUCTOR ELEMENT

CROSS-REFERENCE TO RELATED APPLICATIONS

The present application is based upon and claims the benefit of priority to Japanese Patent Application No. 2013-051949, filed Mar. 14, 2013, the entire contents of which are incorporated herein by reference.

BACKGROUND OF THE INVENTION

1. Field of the Invention

The present invention relates to a multilayer printed wiring board for mounting a semiconductor element and, more particularly, to a multilayer printed wiring board that improves the connection reliability of a semiconductor element.

2. Description of Background Art

Semiconductor elements may be mounted on multilayer printed wiring boards of a so-called package-on-package (PoP) type. Namely, on the horizontally central part of the front surface of a multilayer printed wiring board set as a package substrate, a first semiconductor element (for example, a CPU chip) is directly mounted; and on the front surface of the first multilayer printed wiring board, a second printed wiring board set as a package substrate with a mounted second semiconductor element (for example, a memory chip) is formed to have a greater size than the first semiconductor element and covers the first semiconductor element.

On such a PoP-type printed wiring board, a conductive circuit on the front surface of the printed wiring board is connected to the first semiconductor element through first solder bumps formed on solder pads positioned in the central part on the front surface, while connecting the conductive circuit to the second printed wiring board through second solder bumps, which are set taller than the first solder bumps and are positioned on the solder pads to surround the solder pads in the central part. Moreover, a conductive circuit on the back surface, the other surface of the multilayer printed wiring board, is connected to a motherboard or the like using solder balls (BGA) on solder pads formed in a grid on the back surface (for an example, refer to JP 2008-177503 A). These connections are achieved by using heat to reflow the solder bumps, whose end portions are substantially hemispherical. The entire contents of this publication are incorporated herein by reference.

SUMMARY OF THE INVENTION

According to one aspect of the present invention, a multilayer printed wiring board for mounting a semiconductor element includes a core substrate, a first laminated structure laminated on a first surface of the core substrate and including a conductive circuit layer formed on the first surface of the core substrate, an interlayer resin insulating layer and an outermost conductive circuit layer, and a second laminated structure laminated on a second surface of the core substrate on the opposite side of the core substrate with respect to the first surface and including a conductive circuit layer formed on the second surface of the core substrate, an interlayer resin insulating layer and an outermost conductive circuit layer. The outermost conductive circuit layer in the first laminated structure has solder pads positioned to mount a semiconductor element and solder bumps formed on the solder pads, respectively, the outermost conductive circuit layer in the second laminated structure has solder pads positioned to mount a printed wiring board, and the outermost conductive circuit layers in the first and second laminated structures have thicknesses which are formed greater than thicknesses of the conductive circuit layers on the first and second surfaces of the core substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
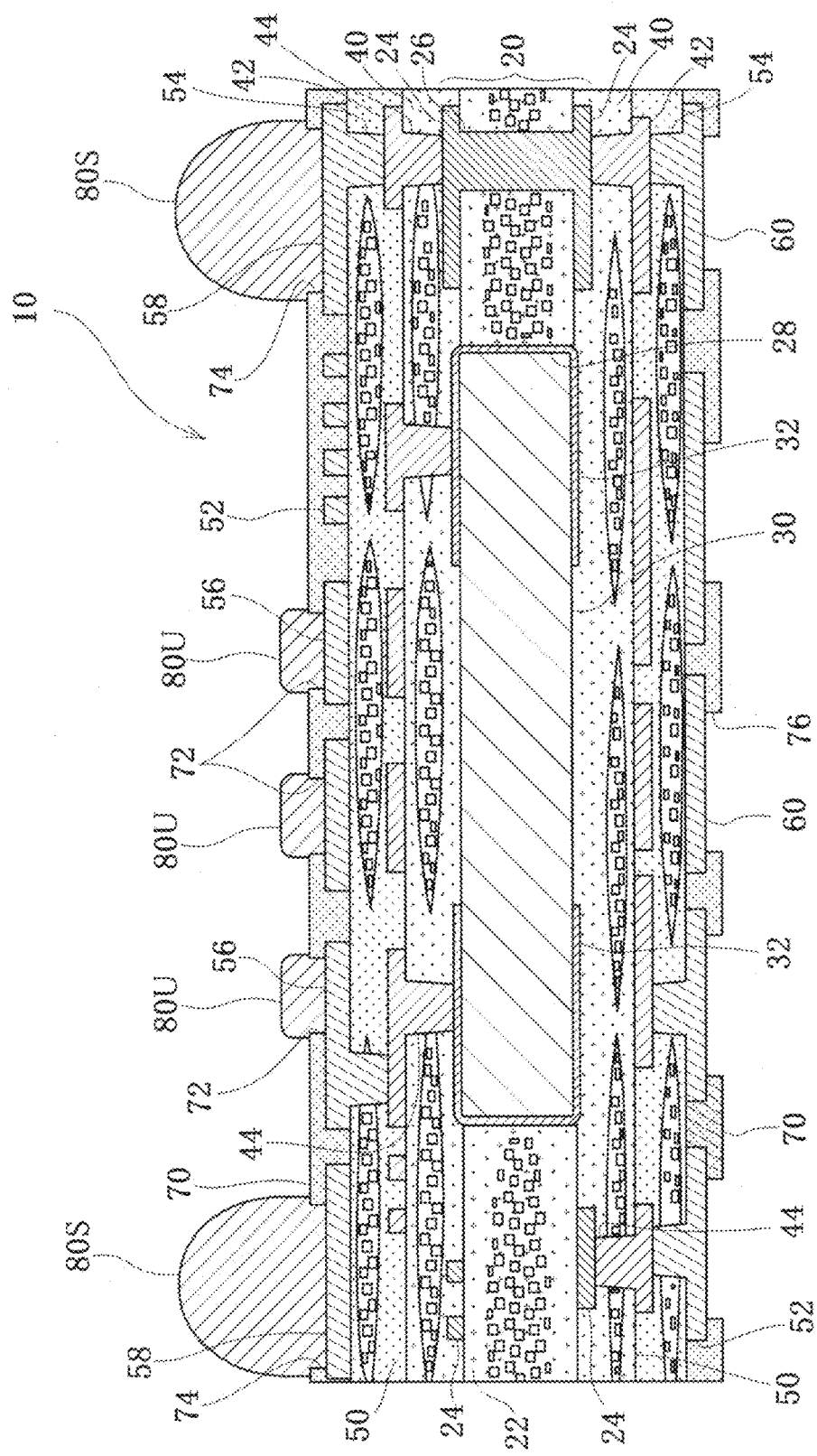
FIG. 1 is a cross-sectional view illustrating a multilayer printed wiring board for mounting a semiconductor element according to an embodiment of the present invention.

The embodiments will now be described with reference to the accompanying drawings, wherein like reference numerals designate corresponding or identical elements throughout the various drawings.

FIG. 1 is a cross-sectional view illustrating a multilayer printed wiring board 10 for mounting a semiconductor element according to an embodiment of the present invention. The multilayer printed wiring board 10 for mounting a semiconductor element of the present embodiment has a single-layer core substrate 20. The core substrate 20 has an insulating substrate 22 and conductive circuit layers 24 formed on both surfaces of the insulating substrate 22. The conductive circuit layer 24 on a first surface (front surface), namely, the upper-side surface in FIG. 1, is connected to the conductive circuit layer 24 on a second surface (back surface), namely, a lower-side surface in FIG. 1, of the core substrate 20 via a through-hole conductor 26.

A through-hole 28 is formed in the central part of the core substrate 20. A chip-type multilayer ceramic capacitor (MLCC) 30, an electronic circuit component, is contained in the through hole 28. The MLCC 30 has U-shaped electrodes 32 at both of its ends.

On each of the conductive circuit layers 24 on both surfaces of the core substrate 20, an interlayer resin insulating layer 40, which is an inner layer of the interlayer resin insulating layers, a conductive circuit layer 42, which is an inner layer of the conductive circuit layers, an interlayer resin insulating layer 50, which is an outermost layer of the interlayer resin insulating layers, and a conductive circuit layer 52, which is an outermost layer of the conductive circuit layers, are sequentially laminated. The conductive circuit layer 42 is electrically connected to the conductive circuit layer 24 through a via conductor 44, which penetrates through the interlayer resin insulating layer 40. The conductive circuit layer 52 is electrically connected to the conductive circuit layer 42 through a via conductor 54, which penetrates through the interlayer resin insulating layer 50. The conductive circuit layer 42 on the first-surface side of the core substrate 20 is electrically connected to the electrodes 32 at both ends of the above-described MLCC 30, which is built into the multilayer printed wiring board 10 for mounting a semiconductor element, through a via conductor 44, which penetrates through the interlayer resin insulating layer 40.

The conductive circuit layer 52, which is the outermost layer on the first-surface side of the core substrate 20, namely, the front side of the multilayer printed wiring board 10 for mounting a semiconductor element, has first solder pads 56 and second solder pads 58. A solder resist layer 70 is formed on the outermost interlayer resin insulating layer 50, via conductor 54, first solder pad 56, and second solder pad 58. The outermost conductive circuit layer 52 on the second-surface side of the core substrate 20, namely, the back side of the multilayer printed wiring board 10 for mounting a semiconductor element, has third solder pads 60. A solder resist layer 70 is also formed on the outermost interlayer resin insulating layer 50, via conductor 54, and third solder pad 60.

The solder resist layer 70 on the first-surface side of the core substrate 20, namely, the front side of the multilayer printed wiring board 10 for mounting a semiconductor element, has first openings 72 and second openings 74, which partially expose the first solder pads 56 and the second solder pads 58, respectively. On the first solder pads 56 in the central part of the front-surface side of the multilayer printed wiring board 10 for mounting a semiconductor element, first solder bumps (80U) are formed in the above-described first openings 72. On the second solder pads 58 in the peripheral part of the front-surface side, second solder bumps (80S), which are taller than the first solder bumps (80U), are formed in the above-described second openings 74. The solder resist layer 70 on the second-surface side of the core substrate 20, namely, the back side of the multilayer printed wiring board 10 for mounting a semiconductor element, has third openings 76, which partially expose the third solder pads 60.

On the multilayer printed wiring board 10 for mounting a semiconductor element structured as above, a semiconductor element such as a CPU chip is directly mounted on the central part on the front-surface side. Connection terminals of the IC chip are connected to the first solder bumps (80U) by reflow. On the front-surface side, a printed substrate, which is a package substrate with a second semiconductor element such as a memory chip and which is made greater than the CPU chip, is mounted so as to cover the CPU chip. Connection terminals of the package substrate are connected by reflow to the second solder bumps (80S), which are taller than the first solder bumps (80U).

On the third solder pads 60 on the back-surface side, solder bumps in a BGA or the like are formed in the third openings 76. With the solder bumps being connected by reflow to solder pads on another printed substrate such as a motherboard, the multilayer printed wiring board 10 for mounting a semiconductor element is mounted on the other printed wiring board.

In the multilayer printed wiring board 10 for mounting a semiconductor element of the present embodiment, the thickness of the front-surface-side outermost conductive circuit layer 52, which has the first solder pads 56 for connection with the CPU chip and the second solder pads 58 for connection with the memory chip, and the thickness of the back-surface-side outermost conductive circuit layer 52, which has the third solder pads 60 for connection with another printed wiring board, are set to be greater than the thickness of the conductive circuit layers 24 on the surfaces of the core substrate 20 or set to be greater than both the thickness of the conductive circuit layers 24 on the surfaces of the core substrate 20 and the thickness of the conductive circuit layers 42, which are inner conductive circuit layers between the interlayer resin insulating layers (40, 50). Also, the thickness of the front-surface-side outermost conductive circuit layer 52, which has the first solder pads 56 for connection with the CPU chip and the second solder pads 58 for connection with the memory chip, is set to be greater than the thickness of the back-surface-side outermost conductive circuit layer 52, which has the third solder pads 60 for connection with the other printed wiring board. The thicknesses of the conductive circuit layers 24 on the surfaces of the core substrate 20 are set to be substantially equal to the thicknesses of the inner conductive circuit layers 42.

By so setting, in the multilayer printed wiring board 10 for mounting a semiconductor element, the thicknesses of the conductive circuit layers satisfy the following: the thickness of the front-surface-side conductive circuit layer 52, which has the first solder pads 56 and the second solder pads 58 for connection with semiconductor elements, is greater than the thickness of the back-surface-side conductive circuit layer 52, which has the third solder pads 60 for connection with another printed wiring board; and the thickness of the back-surface-side conductive circuit layer 52 is greater than the thicknesses of the conductive circuit layers 24 on the surfaces of the core substrate 20 and the thicknesses of the conductive circuit layers 42 between the interlayer resin insulating layers (40, 50).

Accordingly, even if copper on the surfaces of the solder pads (56, 58) for connection with semiconductor elements is alloyed and disappears due to the repeated reflow process described above, the thicknesses of the solder pads (56, 58) do not decrease excessively. Therefore, the solder pads (56, 58) seldom peel off from the interlayer resin insulating layer 50 even when a heat cycle or impact is exerted thereon, and thus, the connection reliability of the semiconductor element is improved.

In a high-temperature environment during reflow, because the thermal expansion coefficient of copper is higher than those of the insulating substrate 22 and interlayer resin insulating layer 50 containing glass cloth or inorganic filler, the copper on the thick solder pads (56, 58) for connection with semiconductor elements expands more in the extending direction of the printed wiring board 10. Therefore, on the printed wiring board 10, warping takes place, resulting in a convexity on the first-surface side (the upper surface in FIG. 1), on which a semiconductor element is mounted. The warping causes the solder bumps to be distanced from each other, and thus short circuiting is less likely to occur. In this respect, the connection reliability of the semiconductor element is also improved.

The multilayer printed wiring board 10 for mounting a semiconductor element of the present embodiment has at least one of the following features: in the whole body of each of the solder pads (56, 58), formed on the front-surface-side outermost conductive circuit layer, the ratio of the thickness (a) of the portion connected to the solder bumps (80S or 80U) and the thickness (b) of the portion not connected thereto is set at b/a>2.0; the thickness of the solder pads 60, formed on the back-surface-side outermost conductive circuit layer, is set at 4 µm or greater under solder bumps; in the whole body of each of the solder pads 60 formed on the back-surface-side outermost conductive circuit layer, the ratio between the thickness (a1) of the portion connected to solder bumps and the thickness (b1) of the portion not connected thereto is set at b1/a1>1.5; a total thickness of the multilayer printed wiring board 10 is set at 200 to 400 µm; and a thickness of the core substrate 20 is set at 50 to 250 µm. By so setting, the multilayer printed wiring board 10 is made sufficiently thin while simultaneously the above-described advantages are achieved simultaneously.

Next, a method for manufacturing the aforementioned multilayer printed wiring board 10 for mounting a semiconductor element will be described below with reference to FIG. 2A to 2C, 3A and 3B.

(1) First, a core substrate 20 is formed. In this process, a copper-clad laminate is used, which is made up of a 60 to 200 µm-thick insulating substrate 22 made of glass cloth impregnated with epoxy resin (glass epoxy resin), and of 3 to 15 µm-thick copper foils laminated on both of its surfaces.

(2) After penetrating holes for through holes are formed in the copper-clad laminate by laser processing, an electroless plating film with a thickness of 1 to 2 µm is formed on both surfaces and the inner wall of the penetrating holes for through holes of the copper-clad laminate by depositing a catalyst such as palladium on the surface layer of the copper-clad laminate and by immersing the copper-clad laminate in an electroless plating solution for 5 to 60 minutes.

(3) Next, a plating resist of a predetermined pattern, which includes a rectangular pattern corresponding to the shape of the aforementioned MLCC 30 in the central part, is formed on both surfaces of the copper-clad laminate.

(4) Next, by performing electrolytic plating, an electrolytic plating film is formed on the portion where the plating resist is not formed, and the penetrating holes for through holes are filled with electrolytic plating.

(5) Conductive circuit layers 24 are formed on both surfaces of the insulating substrate 22 by removing the plating resist and the copper foil under the plating resist by etching, through-hole conductors 26 electrically connecting the conductive circuit layers 24 on both surfaces of the insulating substrate 22 are formed in the penetrating holes for through holes, and in the central part on both surfaces of the insulating substrate 22 a region is formed not to have the conductive circuit layer 24.

Figure 2A:
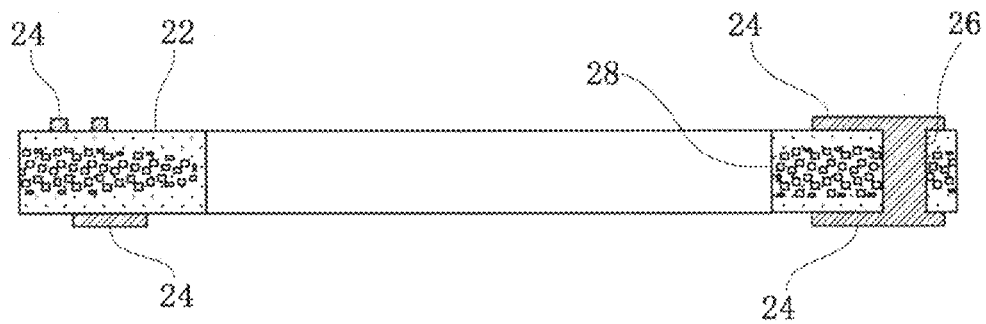
FIGS. 2(A) to 2(C) are cross-sectional views schematically illustrating individual steps for manufacturing the multilayer printed wiring board for mounting a semiconductor element of the above-described embodiment.
Figure 2B:
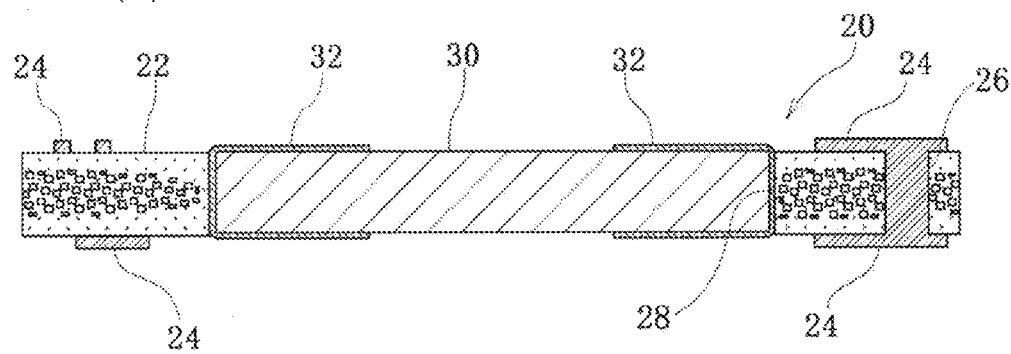

(6) Next, in the above-described region of the insulating substrate 22 where the conductive circuit layer is not formed, a through hole 28 is formed by laser processing along a path corresponding to the outline of the MLCC 30 (refer to FIG. 2A).

(7) The MLCC 30 is placed in the through hole 28 and fixed to the insulating substrate 22 by filling the gap between the MLCC 30 and the through hole 28 with a resin for interlayer insulating layers. Accordingly, the core substrate 20 is completed (refer to FIG. 2B).

(8) On both surfaces of the core substrate 20, a 20 to 50 µm-thick resin material for the interlayer resin insulating layers made of glass epoxy resin and having a 3 to 15 µm-thick copper foil is laminated using a vacuum compression method with the copper foil set to face the outside while the temperature is raised to 30 to 200° C. Accordingly, interlayer resin insulating layers 40 are formed.

(9) Next, via openings are formed in the copper foil and in interlayer resin insulating layer 40 by using a $CO_2$ gas laser.

(10) By depositing a catalyst such as palladium on the surface layer of the interlayer resin insulating layer 40 and by immersing the core substrate 20 in an electroless plating solution for 5 to 60 minutes, electroless plating film with a thickness of 1 to 2 µm is formed on both surfaces of the core substrate 20.

(11) A plating resist having a predetermined pattern is formed through a process of affixing a commercially available photosensitive dry film on the core substrate 20, which has been processed as described above, placing a photo mask film on the photosensitive dry film, exposing the photosensitive dry film, and then developing it using sodium carbonate.

(12) Then, an electrolytic plating film is formed by electrolytic plating on portions left exposed by the plating resist.

Figure 2C:
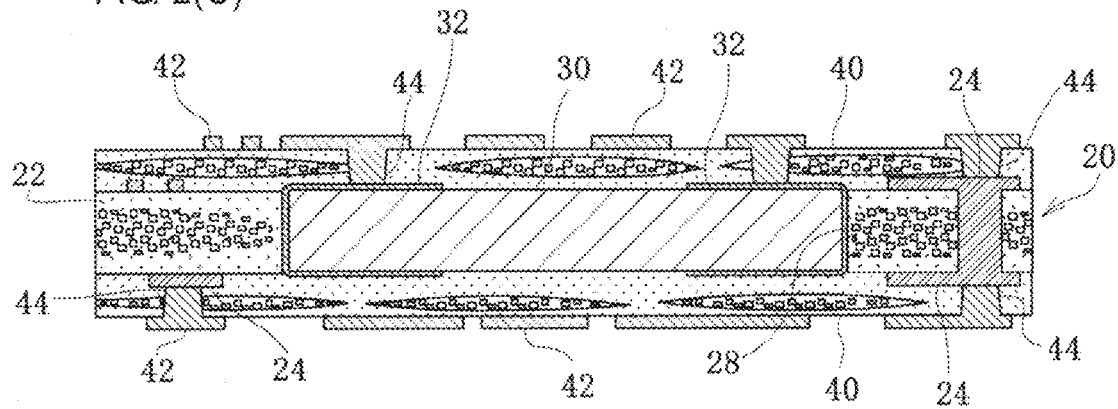

(13) The plating resist is removed and the electroless plating film and copper foil under the plating resist are dissolved away to form a 5 to 10 µm-thick conductive circuit layer 42 made of the copper foil, electroless plating film and electrolytic plating film, via conductors 44 for electrically connecting the conductive circuit layer 42 and the conductive circuit layer 24 on the core substrate 20, and via conductors 44 for electrically connecting the conductive circuit layer 42 and electrodes 32 on both ends of the MLCC 30 (refer to FIG. 2C).

(14) Next, the same as in the above-described steps (8) and (9), an interlayer resin insulating layer 50 having a copper foil is formed, and the same as in the above-described step (10), an electroless plating film, used as an electrode for electrolytic plating, is formed on the interlayer resin insulating layer 50. Then, the same as in the above-described step (11), a plating resist having a predetermined pattern is formed, and the same as in the above-described step (13), an electroless plating film and electrolytic plating film are formed on portions of the copper film left exposed by the plating resist. However, the value of a current fed from an electric clamp connected to the front-surface side is greater than the value of a current fed from an electric clamp connected to the back-surface side. Therefore, a conductive layer formed with electrolytic plating on the front-surface side is made thicker than a conductive layer formed with electrolytic plating on the back-surface side.

Figure 3A:
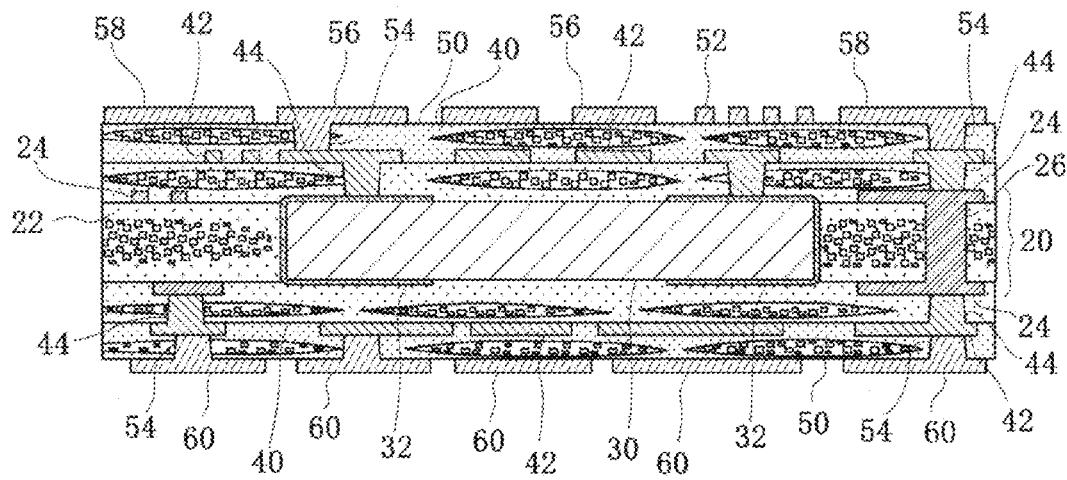
FIGS. 3(A) and 3(B) are cross-sectional views schematically illustrating individual steps for manufacturing the multilayer printed wiring board for mounting a semiconductor element of the above-described embodiment.
Figure 3B:
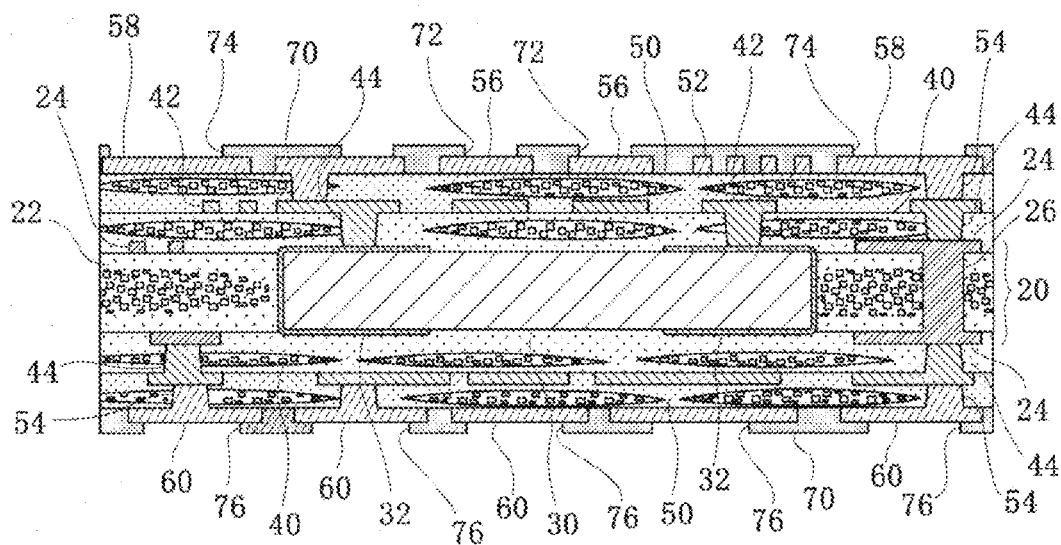

(15) The same as in the above-described step (13), the plating resist is removed, and the copper foil and electroless plating film under the plating resist are dissolved away by etching to form the following: on the first-surface side, which faces upward in FIG. 3A, an outermost conductive circuit layer 52 made up of a copper foil, electroless plating film and electrolytic plating film and having a thickness of 9 to 15 µm, and via conductors 54 for electrically connecting the outermost conductive circuit layer 52 and the conductive circuit layer 42 between the interlayer resin insulating layers (40, 50); and on the second-surface side, which faces downward in FIG. 3A, an outermost conductive circuit layer 52 made up of a copper foil, electroless-plated film and electrolytic-plated film and having a thickness of 7 to 13 µm, and via conductors 54 for electrically connecting the outermost conductive circuit layer 52 and the conductive circuit layer 42 between the interlayer resin insulating layers (40, 50).

The outermost conductive circuit layer 52 on the first-surface (front surface) side, which faces upward in FIG. 3A, has first solder pads 56 to directly mount a semiconductor element and second solder pads 58 to mount a package substrate having a semiconductor element, and the second solder pads 58 have greater diameters than those of the first solder pads 56. The outermost conductive circuit layer 52 on the second-surface (back surface) side, which faces downward in FIG. 3A, has third solder pads 60 to be connected to another printed wiring board (refer to FIG. 3A).

(16) Next, a solder resist layer 70 with a thickness of 35 µm is formed by coating or lamination on the outermost interlayer resin insulating layer 50 and the outermost conductive circuit layer 52 on the first-surface (front-surface) side of the core substrate 20, which has gone through the above-described process steps, and first openings 72 to expose the first solder pads 56 and second openings 74 to expose the second solder pads 58 are formed in the solder resist layer 70 by exposure and development. A solder resist layer 70 with a thickness of 35 µm is also formed by coating or lamination on the outermost interlayer resin insulating layer 50 and the outermost conductive circuit layer 52 on the second-surface (back-surface) side of the core substrate 20, and third openings 76 to expose the third solder pads 60 are formed in the solder resist layer 70 by exposure and development (refer to FIG. 3B).

(17) Then, a nickel-plated layer with a thickness of 5 µm is formed on each of the first solder pads 56 exposed in the first openings 72, the second solder pads 58 exposed in the second openings 74, and the third solder pads 60 exposed in the third openings 76, and a gold-plated layer with a thickness of 0.03 µm is further formed on each nickel-plated layer. Alternatively, a nickel-plated layer with a thickness of 5 µm may be formed first, a palladium-plated layer with a thickness of 0.06 µm may be formed on each nickel-plated layer, and a gold-plated layer with a thickness of 0.03 µm may be further formed thereon. Forming an OSP (Organic Solderability Preservative) film is another alternative.

(18) Then, small-diameter solder balls are first mounted in the first openings 72 on the first-surface (front-surface) side, using a flat plate mask for solder ball mounting, which has through holes corresponding to the first openings 72. Solder material may be mounted by printing as a substitute for the solder balls. Large-diameter solder balls are further mounted in the second openings 74 on the first-surface (front-surface) side, using a flat plate mask for solder ball mounting, which has through holes corresponding to individual openings. In this step, the solder material for the small-diameter solder balls (or the solder material mounted by printing) and the solder material for the large-diameter solder balls have the same composition, for example, solder material with a component ratio of Sn/Ag/Cu=96.5/3.0/0.5. These solder balls therefore have the same melting temperature.

(19) Then, by reflow, first solder bumps (80U) and second solder bumps (80S) are collectively formed in the first openings 72 and the second openings 74, respectively, on the first-surface (front-surface) side. In this process, the first solder bumps (80U) and the second solder bumps (80S) are formed to have substantially semispherical end portions due to surface tension. However, the small-diameter solder balls are formed through the following process to have flat surfaces on the substantially semispherical end portions:

using a die (not shown) which covers the central part of the first-surface (front-surface) side solder resist layer 70 and has downward concavities to accommodate small-diameter solder balls, a reflow is conducted to form the first solder bumps (80U) having substantially hemispherical end portions, then using the bottom surfaces of the downward concavities, flat surfaces are further formed on the substantially semispherical end portions of the first solder bumps (80U). Alternatively, after the reflow, flat surfaces may be formed on the substantially hemispherical end portions by pressing a flat panel (not shown), which covers only the central part of the solder resist layer 70 on the first-surface (front-surface) side, onto the first solder bumps (76U), while keeping the flat panel parallel to the first surface (front surface).

Through those processes above, the MLCC 30 is built inside, while the first solder bumps (80U) and the second solder bumps (80S) are formed in the first openings 72 and the second openings 74, respectively, on the first-surface (front-surface) side (refer to FIG. 1), thus completing manufacturing the multilayer printed wiring board 10 for mounting a semiconductor element.

Next, examples of the multilayer printed wiring board 10 for mounting a semiconductor element according to the embodiment above will be described in comparison with a comparative example. Examples 1 to 3 of the above-described multilayer printed wiring board 10 for mounting a semiconductor element, and Comparative Example 1 of a multilayer printed wiring board for mounting a semiconductor element where conductive circuit layers are made thicker than those in Examples 1 to 3, are each prepared and reflow is applied repeatedly to the examples and the comparative example. The results are shown in Table 1 below. In Table 1, a layer (A) is the outermost conductive circuit layer 52 on the front-surface side, a layer (B) is the outermost conductive circuit layer 52 on the back-surface side, a layer (C) is the conductive circuit layer 42 between the interlayer resin insulating layers (40, 50), a layer (D) is the conductive circuit layer 24 on a surface of the core substrate 20, and a layer (E) is the conducting layer in the layer (A) under the first solder bumps (80U). The unit of thickness is a micron (µm).

TABLE 1

|   | THICKNESS OF LAYER A | THICKNESS OF LAYER B | THICKNESS OF LAYER C | THICKNESS OF LAYER D | THICKNESS OF LAYER E | REFLOW TOTAL TIME (MIN) | PAD PEEL OFF | SUBSTRATE WARP |
|---|---|---|---|---|---|---|---|---|
| EXAMPLE 1 | 13.0 | 11.0 | 8.5 | 8.5 | 7.0 | 48 | NONE | NONE |
| EXAMPLE 2 | 14.0 | 10.0 | 9.0 | 9.0 | 8.0 | 40 | NONE | NONE |
| EXAMPLE 3 | 11.0 | 9.0 | 8.0 | 8.0 | 4.0 | 64 | NONE | NONE |
| COMPARATIVE EXAMPLE 1 | 8.0 | 15.0 | 13.0 | 13.0 | 1.0 | 48 | OBSERVED | OBSERVED |

The results of the above-described reflow test show that neither pad peel-off nor substrate warping was observed in any of Examples 1 to 3 but both pad peel-off and substrate warping were observed in Comparative Example 1. With such results, it is found that excessively thin conductive layer (E) under the first solder bump (80U) causes a pad peel-off or substrate warping.

While an embodiment has been described based on examples shown in the accompanying drawings, it should be understood that a multilayer printed wiring board for mounting a semiconductor element according to the present invention is not limited to the above-described examples and various modifications can be made within the scope of the appended claims. For example, although the insulating substrate 22 and interlayer resin insulating layers (40, 50) both made of glass epoxy resin are used in the above-described embodiment, either or both of them may be a substrate or insulating layer made of regular epoxy resin that is not impregnated into glass cloth. A roughening treatment may be applied to the surfaces of the core substrate, interlayer resin insulating layer, or conductive circuit layer appropriately, though its description is omitted in the above-described manufacturing method. Furthermore, a multilayer printed wiring board for mounting a semiconductor element according to an embodiment of the present invention may also have solder bumps in the third openings 76 on the second-surface (back-surface) side.

Although the MLCC 30 is built into the multilayer printed wiring board for mounting a semiconductor element in the above-described embodiment, it is an option to employ an electronic circuit component other than the MLCC 30, or not to employ any electronic circuit component. A semiconductor element mounted on a multilayer printed wiring board for mounting a semiconductor element according to an embodiment of the present invention is not limited to a CPU (Central Processing Unit) chip nor to a memory chip. Other types of semiconductor elements may also be used.

According to a multilayer printed wiring board for mounting a semiconductor element according to an embodiment of the present invention, the thickness of a front-surface-side outermost conductive circuit layer having solder pads for connection with a semiconductor element and the thickness of a back-surface-side outermost conductive circuit layer having solder pads for connection with another printed wiring board are greater than the thickness of a conductive circuit layer on a surface of a core substrate. Thus, even if copper on the surface of the solder pads for connection with a semiconductor element and the solder pads for connection with another printed wiring board disappears due to alloying caused by repeated reflow, the thickness of the solder pads does not decrease excessively. Accordingly, the solder pads are less likely to peel off from the interlayer resin insulating layer even under a heat cycle or impact, and the connection reliability of the semiconductor element is improved.

Reflow may be applied multiple times, namely, when a conductive circuit on a multilayer printed wiring board is connected to the first semiconductor element through the first solder bumps, when the conductive circuit on the multilayer printed wiring board is connected to the second printed wiring board through the second solder bumps, when a conductive circuit on the multilayer printed wiring board is connected to a motherboard or the like through solder bumps, and when hemispherical solder bumps are formed by fusing solder balls or solder paste on solder pads.

Figure 4:
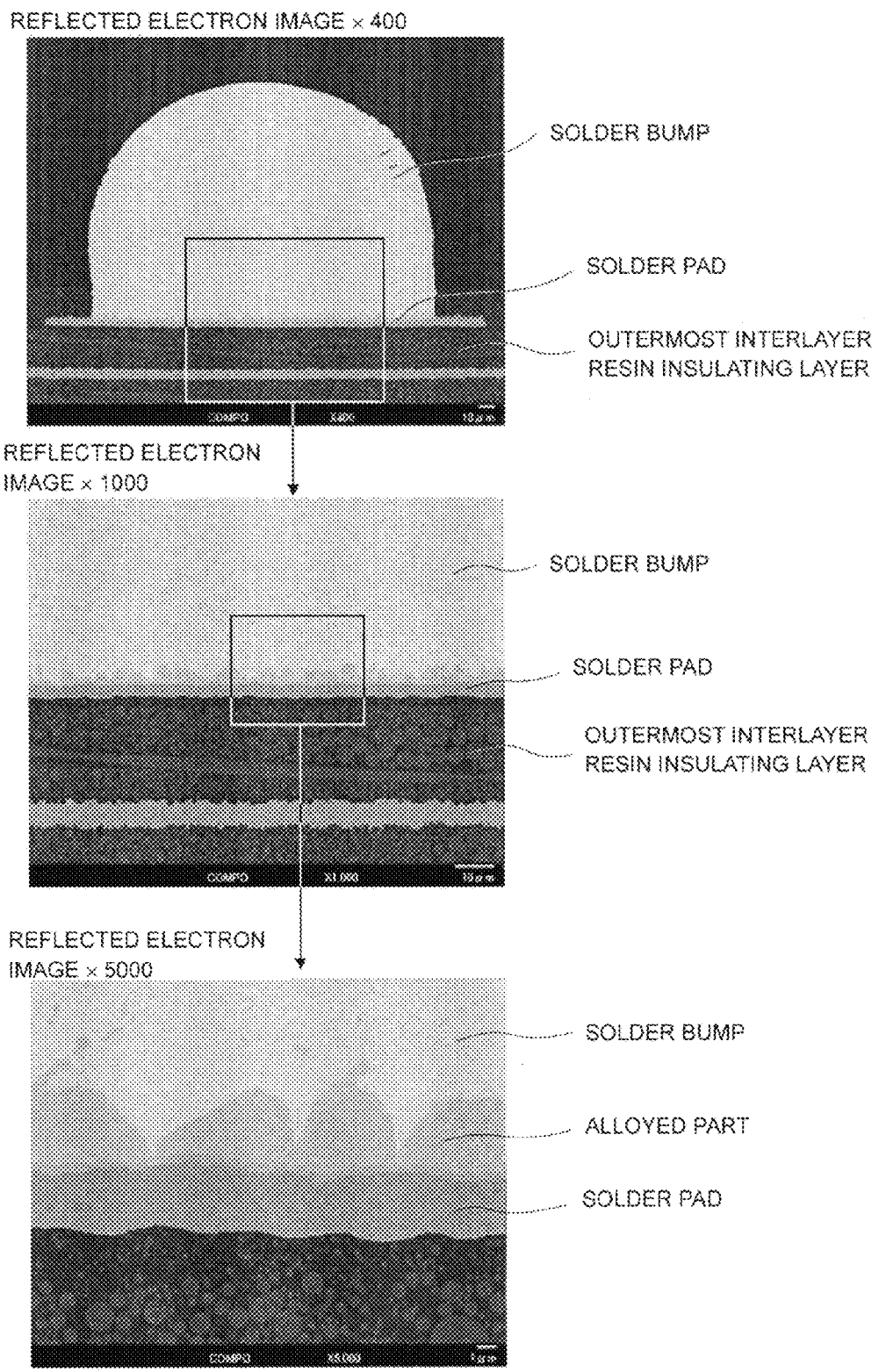
FIG. 4 is a set of electron micrographic images showing magnified cross-sectional views of a solder bump and a solder pad directly under the solder bump, which are formed after reflow is experimentally applied 11 times to a conventional multilayer printed wiring board for mounting a semiconductor element.
Figure 5:
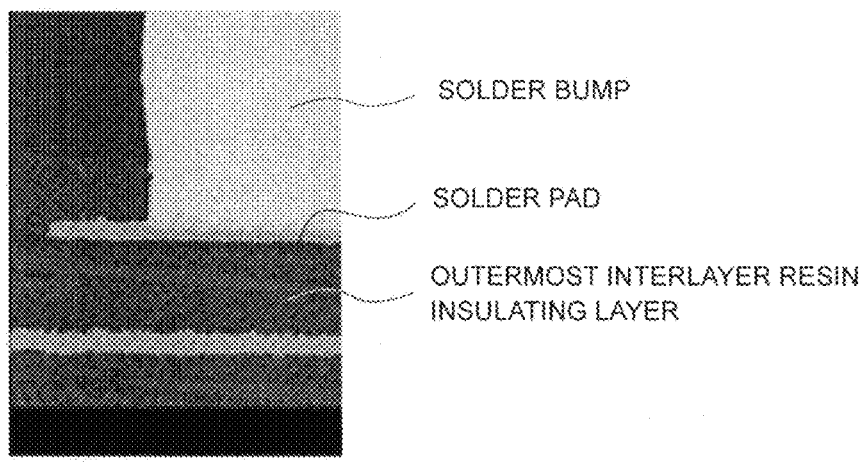
FIG. 5 is an electron micrographic image showing a magnified view of a boundary portion between the solder bump and solder pad shown in FIG. 4.
Figure 6:
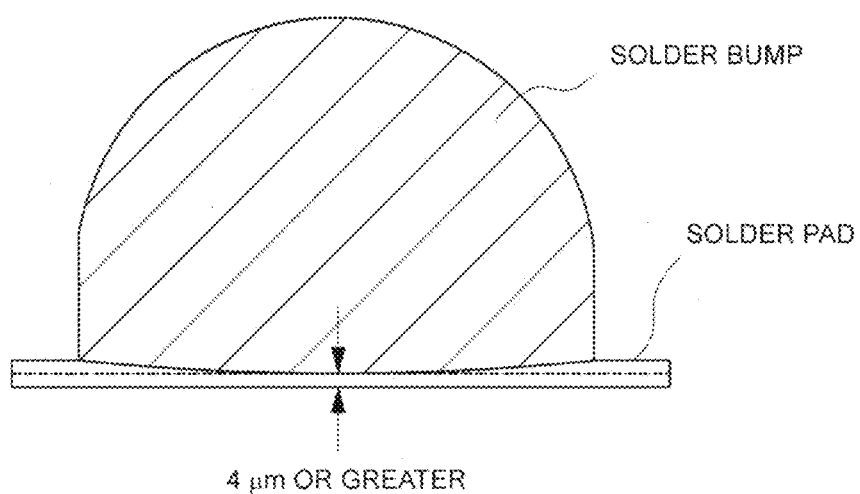
FIG. 6 is a diagram illustrating the shape of the boundary portion between the solder bump and the solder pad directly under the solder bump shown in FIG. 4.

However, as FIG. 4 illustrates a solder bump and solder pad directly under the solder bump after reflow is applied 11 times experimentally, while FIG. 5 illustrates a magnified boundary portion between the solder bump and solder pad shown in FIG. 4, and FIG. 6 illustrates the shape of the boundary portion between the solder bump and solder pad shown in FIG. 4, if reflow is applied multiple times, it is found that copper on the surface of a solder pad directly under a solder bump disappears because of an alloy formed due to heat at the boundary between the copper of the solder pad and tin or the like of the solder bump. As a result, when the thickness of a solder pad decreases excessively, a thin portion of the solder pad easily peels off from an interlayer resin insulating layer due to a heat cycle or from impact, and problems arise such that the connection reliability of the semiconductor element deteriorates.

The decrease of copper on the front surface of the substrate, namely, the surface on which a semiconductor element is mounted, leads to a change in strength balance between both surfaces, and the change causes warping of the multilayer printed wiring board in a direction to form a concavity on the front-surface side. The warping easily causes short circuiting due to solder bumps being too close to each other, which also leads to problems involving a decrease in the connection reliability of semiconductor elements.

A multilayer printed wiring board for mounting a semiconductor element according to an embodiment of the present invention has interlayer resin insulating layers laminated alternately with conductive circuit layers on both surfaces of a core substrate. On the front surface, which is one surface of the multilayer printed wiring board, the outermost conductive circuit layer is provided with solder pads for connection with a semiconductor element, solder bumps are formed on the solder pads for connection with a semiconductor element, and on the back surface, which is the other surface of the multilayer printed wiring board, the outermost conductive circuit layer is provided with solder pads for connection with another printed wiring board. In such a multilayer printed wiring board, the outermost conductive circuit layer on the front surface and the outermost conductive circuit layer on the back surface are set thicker than the conductive circuit layers on the surfaces of the core substrate.

According to the printed wiring board for mounting a semiconductor element as described above, the thickness of the front-surface-side outermost conductive circuit layer having solder pads for connection with a semiconductor element and the thickness of the back-surface-side outermost conductive circuit layer having solder pads for connection with another printed wiring board are set greater than the thickness of the conductive circuit layers on the surfaces of the core substrate. Therefore, even if copper on the surface of the solder pads for connection with a semiconductor element and the solder pads for connection with another printed wiring board disappears due to alloying caused by repeated reflow, a significant decrease in the thickness of the solder pads does not occur. Therefore, the solder pads are less likely to peel off from the interlayer resin insulating layer even under a heat cycle or impact. With such a structure, the connection reliability of the semiconductor element is improved.

A printed wiring board for mounting a semiconductor element according to an embodiment of the present invention is preferred to satisfy a relationship such that the front-surface-side outermost conductive circuit layer is thicker than the back-surface-side outermost conductive circuit layer, which is thicker than the conductive circuit layers on both surfaces of the core substrate. By satisfying such a relationship between the thicknesses of conductive circuit layers, since copper generally has a higher thermal expansion coefficient than resin, the copper of the thick solder pads for connection with a semiconductor element on the front surface expands in the extending direction of the printed wiring board at a high temperature during the reflow. Thus, in the printed wiring board for mounting a semiconductor element, warping occurs in a direction to form a convexity on the front surface side. Such warping causes the solder bumps to be distanced from each other, and thus short circuiting is less likely to occur. Accordingly, the connection reliability of the semiconductor element is further improved.

A multilayer printed wiring board for mounting a semiconductor element according to an embodiment of the present invention is preferred to satisfy a relationship such that the front-surface-side outermost conductive circuit layer is thicker than the back-surface-side outermost conductive circuit layer, which is thicker than the conductive circuit layers on both surfaces of the core substrate, while the front-surfaceside outermost conductive circuit layer is set to have a thickness of 9 to 18 μm, the back-surface-side outermost conductive circuit layer is set to have a thickness of 7 to 16 μm, and the conductive circuit layers on both surfaces of the core substrate are set to have a thickness of 5 to 10 μm. By so setting, a sufficiently thin multilayer printed wiring board is obtained, while a condition is satisfied so that the front-surface-side outermost conductive circuit layer having solder pads for connection with a semiconductor element is thicker than the back-surface-side outermost conductive circuit layer having solder pads for connection with another printed wiring board, which is thicker than the conductive circuit layers on both surfaces of the core substrate.

In a multilayer printed wiring board for mounting a semiconductor element according to an embodiment of the present invention, the solder pads for connection with a semiconductor element, which are formed on the front-surface-side outermost conductive circuit layer, are preferred to have a thickness of 4 μm or greater under solder bumps. By so setting, because the thickness of the solder pads under solder bumps does not decrease excessively, the solder pads are less likely to peel off from the interlayer resin insulating layer even when a heat cycle or impact is exerted thereon. Accordingly, the connection reliability of the semiconductor element is improved.

It is also preferred that a multilayer printed wiring board for mounting a semiconductor element according to an embodiment of the present invention has the following conditions: in the whole body of each of the solder pads formed on the front-surface-side outermost conductive circuit layer, the ratio of the thickness (a) of the portion connected to a solder bump and the thickness (b) of the portion not connected thereto be set at $b/a > 2.0$; and/or the thickness of the solder pads formed on the back-surface-side outermost conductive circuit layer be set at 4 μm or greater under solder bumps; and/or in the whole body of each of the solder pads formed on the back-surface-side outermost conductive circuit layer, the ratio between the thickness (a1) of the portion connected to a solder bump and the thickness (b1) of the portion not connected thereto be set at $b1/a1 > 1.5$; and/or a total thickness of the multilayer printed wiring board be set at 200 to 400 μm; and/or a thickness of the core substrate be set at 50 to 250 μm.

In addition, it is preferred that a multilayer printed wiring board for mounting a semiconductor element according to an embodiment of the present invention further includes an inner interlayer resin insulating layer and an inner conductive circuit layer between the core substrate and the interlayer resin insulating layer, and that the thickness of the inner conductive circuit layer be substantially the same as the thickness of the conductive circuit layer on a surface of the core substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board for mounting a semiconductor element, comprising:
    a core substrate;
    a first laminated structure laminated on a first surface of the core substrate and comprising a conductive circuit layer formed on the first surface of the core substrate, an interlayer resin insulating layer and an outermost conductive circuit layer; and
    a second laminated structure laminated on a second surface of the core substrate on an opposite side of the core substrate with respect to the first surface and comprising a conductive circuit layer formed on the second surface of the core substrate, an interlayer resin insulating layer and an outermost conductive circuit layer,
    wherein the outermost conductive circuit layer in the first laminated structure has a plurality of first solder pads positioned to mount a semiconductor element and a plurality of second solder pads positioned to mount a package substrate, the outermost conductive circuit layer in the second laminated structure has a plurality of solder pads positioned to mount a printed substrate, the outermost conductive circuit layer in the first laminated structure has a thickness which is formed greater than a thickness of the conductive circuit layer on the first surface of the core substrate, the outermost conductive circuit layer in the second laminated structure has a thicknesses which is formed greater than a thickness of the conductive circuit layer on the second surface of the core substrate, the thickness of the outermost conductive circuit layer in the first laminated structure is formed greater than the thickness of the outermost conductive circuit layer in the second laminated structure, and the first and second solder pads in the outermost conductive circuit layer in the first laminated structure are formed such that the first and second solder pads have contact portions configured to contact with solder bumps and non-contact portions configured not to contact with the solder bumps, respectively, and that the contact portions of the first and second solder pads and the non-contact portions of the first and second solder pads satisfy $b/a > 2.0$ where a represents thicknesses of the contact portions and b represents thicknesses of the non-contact portions.

2. The multilayer printed wiring board according to claim 1, wherein the thickness of the outermost conductive circuit layer in the second laminated structure is formed greater than the thickness of the conductive circuit layer on the first surface of the core substrate.

3. The multilayer printed wiring board according to claim 2, wherein the thickness of the outermost conductive circuit layer in the first laminated structure is formed in a range of 9 μm to 18 μm, the thickness of the outermost conductive circuit layer in the second laminated structure is formed in a range of 7 μm to 16 μm, and the thicknesses of the conductive circuit layers on the first and second surfaces of the core substrate are formed in a range of 5 μm to 10 μm.

4. The multilayer printed wiring board according to claim 1, further comprising:
    a plurality of first solder bumps formed on the plurality of first solder pads, respectively; and
    a plurality of second solder bumps formed on the plurality of second solder pads, respectively,
    wherein the first and second solder pads in the outermost conductive circuit layer in the first laminated structure are formed such that the first and second solder pads have thicknesses of 4 μm or greater underneath the first and second solder bumps, respectively.

5. The multilayer printed wiring board according to claim 1, wherein the solder pads in the outermost conductive circuit layer in the second laminated structure are formed such that the solder pads have portions configured to be in contact with solder bumps and having thicknesses of 4 μm or greater, respectively.

6. The multilayer printed wiring board according to claim 1, wherein the solder pads in the outermost conductive circuit layer in the second laminated structure are formed such that the solder pads have contact portions configured to be in contact with solder bumps and non-contact portions configured not to be in contact with the solder bumps, respectively, and that the contact portions of the solder pads and the non-contact portions of the solder pads satisfy b1/a1>1.5 where a1 represents thicknesses of the contact portions and b1 represents thicknesses of the non-contact portions.

7. The multilayer printed wiring board according to claim 1, wherein the multilayer printed wiring board has a total thickness formed in a range of 200 μm to 400 μm.

8. The multilayer printed wiring board according to claim 1, wherein the core substrate has a thickness formed in a range of 50 μm to 250 μm.

9. The multilayer printed wiring board according to claim 1, wherein at least one of the first and second laminated structures has an inner interlayer resin insulating layer and an inner conductive circuit layer formed between the core substrate and the interlayer resin insulating layer of a respective one of the first and second laminated structures, and the inner conductive circuit layer has a thickness which is formed substantially equal to the thicknesses of the conductive circuit layers formed on the first and the second surfaces of the core substrate.

10. The multilayer printed wiring board according to claim 1, wherein at least one of the first and second laminated structures has an inner interlayer resin insulating layer and an inner conductive circuit layer formed between the core substrate and the interlayer resin insulating layer of a respective one of the first and second laminated structures, and the thicknesses of the outermost conductive circuit layers in the first and second laminated structures are formed greater than a thickness of the inner conductive circuit layer.

11. The multilayer printed wiring board according to claim 2, further comprising:
a plurality of first solder bumps formed on the plurality of first solder pads, respectively; and
a plurality of second solder bumps formed on the plurality of second solder pads, respectively,
wherein the first and second solder pads in the outermost conductive circuit layer in the first laminated structure are formed such that the first and second solder pads have thicknesses of 4 μm or greater underneath the first and second solder bumps, respectively.

12. The multilayer printed wiring board according to claim 2, further comprising:
a plurality of first solder bumps formed on the plurality of first solder pads, respectively; and
a plurality of second solder bumps formed on the plurality of second solder pads, respectively,
wherein the first and second solder pads in the outermost conductive circuit layer in the first laminated structure are formed such that the first and second solder pads have contact portions in contact with the first and second solder bumps and non-contact portions not in contact with the first and second solder bumps, respectively, and that the contact portions of the first and second solder pads and the non-contact portions of the first and second solder pads satisfy b/a>2.0 where a represents thicknesses of the contact portions and b represents thicknesses of the non-contact portions.

13. The multilayer printed wiring board according to claim 2, wherein the solder pads in the outermost conductive circuit layer in the second laminated structure are formed such that the solder pads have portions configured to be in contact with solder bumps and having thicknesses of 4 μm or greater underneath the solder bumps, respectively.

14. The multilayer printed wiring board according to claim 2, wherein the solder pads in the outermost conductive circuit layer in the second laminated structure are formed such that the solder pads have contact portions configured to be in contact with solder bumps and non-contact portions configured not to be in contact with the solder bumps, respectively, and that the contact portions of the solder pads and the non-contact portions of the solder pads satisfy b1/a1>1.5 where a1 represents thicknesses of the contact portions and b1 represents thicknesses of the non-contact portions.

15. The multilayer printed wiring board according to claim 2, wherein the multilayer printed wiring board has a total thickness formed in a range of 200 μm to 400 μm.

16. The multilayer printed wiring board according to claim 2, wherein the core substrate has a thickness formed in a range of 50 μm to 250 μm.

17. The multilayer printed wiring board according to claim 1, further comprising:
a plurality of first solder bumps formed on the plurality of first solder pads, respectively; and
a plurality of second solder bumps formed on the plurality of second solder pads, respectively,
wherein the first and second solder pads in the outermost conductive circuit layer in the first laminated structure are formed such that the first and second solder pads have thicknesses of 4 μm or greater underneath the solder bumps, respectively, and the first and second solder pads in the outermost conductive circuit layer in the first laminated structure are formed such that the first and second solder pads have contact portions in contact with the first and second solder bumps and non-contact portions not in contact with the first and second solder bumps, respectively, and that the contact portions of the first and second solder pads and the non-contact portions of the first and second solder pads satisfy b/a>2.0 where a represents thicknesses of the contact portions and b represents thicknesses of the non-contact portions.

18. The multilayer printed wiring board according to claim 1, further comprising:
a plurality of first solder bumps formed on the plurality of first solder pads, respectively; and
a plurality of second solder bumps formed on the plurality of second solder pads, respectively,
wherein the first and second solder pads in the outermost conductive circuit layer in the first laminated structure are formed such that the first and second solder pads have contact portions in contact with the first and second solder bumps and non-contact portions not in contact with the first and second solder bumps, respectively, and that the contact portions of the first and second solder pads and the non-contact portions of the first and second solder pads satisfy b/a>2.0 where a represents thicknesses of the contact portions and b represents thicknesses of the non-contact portions, and the solder pads in the outermost conductive circuit layer in the second laminated structure are formed such that the solder pads have contact portions configured to be in contact with solder bumps and non-contact portions configured not to be in contact with the solder bumps, respectively, and that the contact portions of the solder pads and the non-contact portions of the solder pads satisfy b1/a1>1.5 where a1 represents thicknesses of the contact portions and b1 represents thicknesses of the non-contact portions.

19. The multilayer printed wiring board according to claim 1, further comprising:
a plurality of first solder bumps formed on the plurality of first solder pads, respectively; and
a plurality of second solder bumps formed on the plurality of second solder pads, respectively, wherein the first laminated structure includes a solder resist layer formed on the outermost conductive circuit layer in the first laminated structure such that the first and second solder bumps are exposed from the solder resist layer, and the second laminated structure includes a solder resist layer formed on the outermost conductive circuit layer in the second laminated structure such that the solder pads are exposed from the solder resist layer.

20. The multilayer printed wiring board according to claim 1, further comprising:
a plurality of first solder bumps formed on the plurality of first solder pads, respectively; and
a plurality of second solder bumps formed on the plurality of second solder pads, respectively,
wherein the plurality of first solder bumps and the plurality of second solder bumps are formed such that the plurality of second solder bumps has a height which is greater than a height of plurality of the first solder bumps.

\* \* \* \* \*